US005757211A

United States Patent [19]

Phillips

[11] Patent Number: 5,757,211
[45] Date of Patent: May 26, 1998

[54] IC PRECISION RESISTOR RATIO MATCHING WITH DIFFERENT TUB BIAS VOLTAGES

[75] Inventor: William Aidan Phillips, Royal Oak, Mich.

[73] Assignee: SGS-Thomson Microelectronics, Inc., Carrollton, Tex.

[21] Appl. No.: 774,912

[22] Filed: Dec. 27, 1996

[51] Int. Cl.$^6$ ........................................... H02P 6/06
[52] U.S. Cl. ........................ 327/73; 327/72; 327/59; 327/538
[58] Field of Search ........................... 327/59, 60, 63, 327/68, 70, 72, 73, 74, 77, 78, 83, 87, 88, 89, 538, 543

[56] References Cited

U.S. PATENT DOCUMENTS

| | | | |
|---|---|---|---|
| 4,066,945 | 1/1978 | Korte, Jr. | 318/681 |
| 4,757,241 | 7/1988 | Young | 318/254 |
| 5,061,884 | 10/1991 | Saganovsky | 318/431 |
| 5,408,694 | 4/1995 | Tran | 327/72 |

*Primary Examiner*—Timothy P. Callahan
*Assistant Examiner*—T. T. Lam
*Attorney, Agent, or Firm*—Theodore E. Galanthay; Lisa K. Jorgenson

[57] ABSTRACT

An integrated circuit motor controller having two or more integrated resistor dividers which produce signals to be compared with each other is disclosed. The circuit is designed to substantially reduce the dependency of the comparison on the reverse bias of the junctions between diffused resistors in the integrated resistor dividers and the silicon into which they are diffused.

20 Claims, 2 Drawing Sheets

IC PRECISION RESISTOR RATIO MATCHING WITH DIFFERENT TUB BIAS VOLTAGES

FIELD OF THE INVENTION

The present invention relates to controllers for controlling a system and, more particularly, to motor controllers including an integrated circuit for controlling a motor.

BACKGROUND OF THE INVENTION

In an integrated circuit (IC) used for controlling a system, such as a motor, where two or more integrated resistor dividers produce signals to be compared with each other, accuracy of the comparison depends not only on the matching of the resistor divider diffusions but also on the reverse bias of the junction between the diffused resistors and the silicon into which they are diffused.

Referring now to FIGS. 1A and 1B, the symbol and construction of a diffused resistor used in such an IC will be described.

Referring now to FIG. 1A, the symbol for a diffused resistor 10 is shown, having an isolation pocket or tub tie contact 12 for introducing a bias voltage for controlling the resistance of the diffused resistor 10 between a first resistor contact 14 and a second resistor contact 16.

Referring now to FIG. 1B, the construction of a p type diffused resistor will be described. Reference numerals used in FIG. 1B which are identical, like or similar to reference numerals used in FIG. 1A indicate like or similar components. Diffused resistor 10 includes contacts 12, 14, and 16, preferably constructed from a metal. P type diffused resistor 10 is constructed on a p substrate 18 having an n epitaxial layer 20, p+ isolation region 22, and n+ layer 24. P type diffused resistor 10 further includes a p resistor diffusion of p type material 25 diffused into the n epitaxial layer 20. P resistor diffusion 25 extends from metal contact 14 to metal contact 16. An n+ material 26 is diffused into the n epitaxial layer 20 in abutting engagement with isolation pocket or tub tie contact 12. P type diffused resistor 10 further includes a top silicon dioxide (SiO$_2$)layer 28 and a p resistor diffusion to n epitaxial layer junction 27. For proper operation of resistor 10, the n epitaxial layer 20 must be at or above the highest potential of the p resistor diffusion 25 in order to keep the p resistor diffusion to n epitaxial layer junction 27 reverse biased. As junction 27 reverse bias increases, a depletion layer forms and moves into p type diffusion 25, reducing the volume of silicon available for use as a resistor and, hence, increasing the resistance value of resistor 10 between contacts 14 and 16.

Referring now to FIGS. 2A and 2B, a prior art control system 30 is shown. Control system 30 includes a system under control 32 having an input 34 and an output 36.

Referring to FIG. 2A, an example of a typical system under control 32 is illustrated. System under control 32 includes a motor 38 having an input 34 and an output 36. Motor 38 includes a position sensor 40 for providing position information signals to output 36.

Referring now to FIG. 2B, input 34 receives a control signal from a controller 42. Controller 42 is an integrated circuit including an output 44 for outputting the control signal to input 34. Controller 42 further includes voltage inputs 46 and 48 for inputting operating voltages V$_{CC}$ and GND, respectively, and a command signal input 50 for entering a command signal to control the system under control 32 via the control signal outputted from output 44. Controller 42 also includes a position feedback signal input 52 for coupling to the output 36 of the system under control 32 for feedbacking a position feedback signal to controller 42. Controller 42 further includes a first resistor divider circuit 54 and a second resistor divider circuit 56. First resistor divider circuit 54 comprises a first diffused resistor R1 58 and a second diffused resistor R2 60. Second resistor divider circuit 56 comprises third diffused resistor R3 62 and fourth diffused resistor R4 64. In this prior art example, the resistance value of resistor 58 equals the resistance value of resistor 60, the resistance value of resistor 62 equals the resistance value of resistor 64, and resistors 58, 60, 62, and 64 are p type diffused in an n epitaxial layer in a junction isolated technology such as described in connection with FIG. 1.

In the description which follows, reference numerals of parts shown in FIG. 1 will be made to describe the operation of and the construction of resistors 58, 60, 62, and 64. Thus, reference numerals used in the description of FIGS. 2A or 2B which are identical, like or similar to reference numerals used in FIGS. 1A or 1B indicate like or similar components. Controller 42 further includes an error amplifier 66. Error amplifier 66 receives a first voltage error signal (V$_1$) from first resistor divider circuit 54 and a second voltage reference signal (V$_2$) from second resistor divider circuit 56 and outputs the control signal via output 44. In this sample control scheme, the system under control 32 comes to rest when the voltage V$_1$ of first signal from resistor divider circuit 54 is equal to the voltage V$_2$ of second signal from second resistor divider circuit 56 or at rest the voltage of the command signal added to the voltage of the position feedback signal is equal to V$_{CC}$ or as expressed in the following equation: V$_{COM}$+V$_{FB}$=V$_{CC}$ wherein R1 is equal to R2, and R3 is equal to R4. It will be appreciated that resistor ratio matching is only important as the system under control 32 comes to its resting point. The n+ epitaxial isolation pocket 26 or tub tie contacts 12 of resistors 58, 60 are tied to the highest potential expected on V$_{COM}$ and V$_{FB}$ (V$_{CC}$ in this example), because tub tie contact 12 must be biased at or above the highest potential expected on the p type diffusion 25 of resistors 58, 60 so that junction 27 remains reverse biased. Thus, tub tie contacts 12 of resistors 58, 60 are fixed at V$_{CC}$. In a similar manner, tub tie contact 12 of resistor 62 is fixed at V$_{CC}$. Tub tie contact 12 of resistor 64 is tied to a mutual contact coupling resistors 62, 64, fixing the voltage at a value determined by the ratio of the resistance value of resistor 62 to that of resistor 64. Alternatively, tub tie contact 12 of resistor 64 may also be tied to V$_{CC}$.

For V$_1$=V$_2$ when system 32 comes to rest, V$_{COM}$+V$_{FB}$ must equal V$_{CC}$, and R1/R2−R3/R4 must equal 0. Thus, the accuracy or error of control system 30 is measured by R1/R2−R3/R4 as a fraction of either R1/R2 or R3/R4.

The following demonstrates the error introduced into control system 30 by the bias voltages applied to tub tie contacts 12, contacts 14, and contacts 16 of resistors 58, 60, 62, 64. The following equations assume that the resistance of a typical resistor varies linearly where R=R$_0$(1+C$_V$ V$_T$) wherein R$_0$ and C$_V$ are constants and V$_T$=average tub bias voltage=V$_A$−V$_C$+V$_D$/2 wherein V$_A$ is the voltage at tub tie contact 12, V$_C$ is the voltage at contact 14, and V$_D$ is the voltage at contact 16. Letting V$_{COM}$=V$_{CC}$. V$_{FB}$=0v, and V$_1$=V$_2$=V$_{CC}$/2, it follows that:

$$\frac{R1}{R2} = \frac{1+C_V\left(V_{CC} - \frac{V_{CC} + \frac{V_{CC}}{2}}{2}\right)}{1+C_V\left(V_{CC} - \frac{V_{CC}+0}{2}\right)} \text{ and}$$

$$\frac{R_3}{R_4} = \frac{1+C_V\left(V_{CC} - \frac{V_{CC} + \frac{V_{CC}}{2}}{2}\right)}{1+C_V\left(\frac{V_{CC}}{2} - \frac{\frac{V_{CC}}{2}+0}{2}\right)}.$$

If $C_V=0.003$ and $V_{CC}=20v$, then R1/R2=0.9713 and R3/R4=1.0000, and the percentage difference between R1/R2 and R3/R4 is 2.9%.

What is needed is an integrated circuit controller having two or more integrated resistor dividers producing signals to be compared with each other wherein the accuracy of the comparison depends only on the ratio matching of the resistor divider diffusions and not on the reverse bias of the junctions between the diffused resistors and the silicon in which they are diffused.

SUMMARY OF THE INVENTION

Accordingly, the present invention provides a controller for controlling a system including a control circuit comprising a command signal input for inputting a command signal, a feedback signal input for inputting a feedback signal from the system, a first resistor divider circuit including first and second resistors for outputting a first signal in response to the command and feedback signals, and a second resistor divider circuit including third and fourth resistors for outputting a second signal for comparison to the first signal. The controller further includes tub tie contacts for introducing bias voltages for biasing the resistors of the resistor divider circuits wherein at least one of the command or feedback signal inputs is coupled to at least one of the tub tie contacts for biasing at least one of the resistors with either the command or feedback signal so that the bias voltages do not introduce substantial error in a comparison of the first and second signals.

The present invention also provides a method for controlling a system. The method comprises the steps of providing a first resistor divider circuit including first and second resistors for outputting a first signal in response to command and feedback signals; providing a second resistor divider circuit including third and fourth resistors for outputting a second signal for comparison to the first signal; introducing bias voltages for biasing said resistors of the resistor divider circuits; and biasing at least one of the resistors with at least one of the command or feedback signals so that the bias voltages do not introduce substantial error in a comparison of the first and second signals.

The primary advantage of the present invention is the substantial reduction of the dependence on bias voltages in the comparison of signals from two or more integrated resistor dividers.

DETAILED DESCRIPTION OF A PREFERRED EMBODIMENT OF THE INVENTION

Figure 1A:
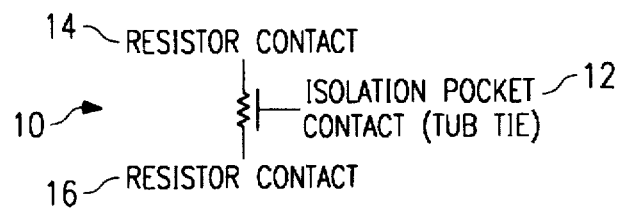
FIG. 1A illustrates the circuit symbol for a diffused resistor utilized in the present invention.
Figure 1B:
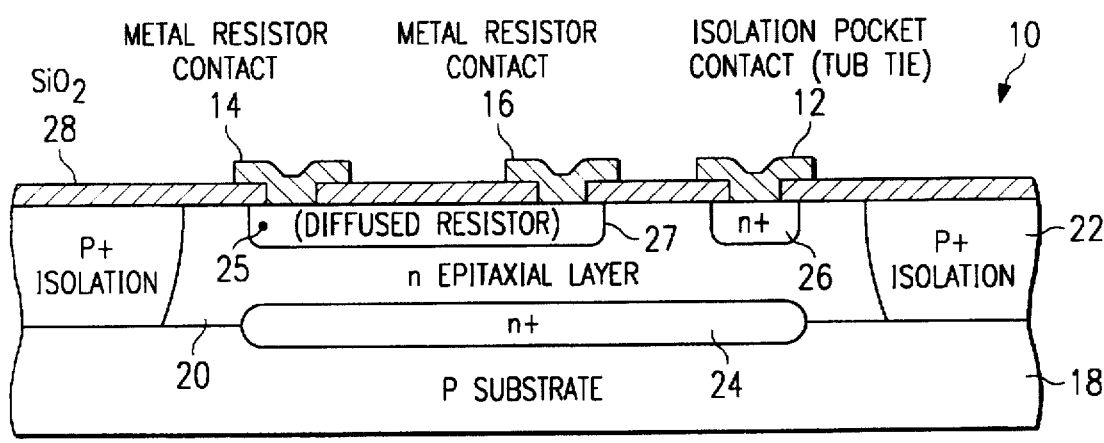
FIG. 1B illustrates an example of the construction of a diffused resistor symbolized in FIG. 1A and utilized in the present invention.
Figure 2A:
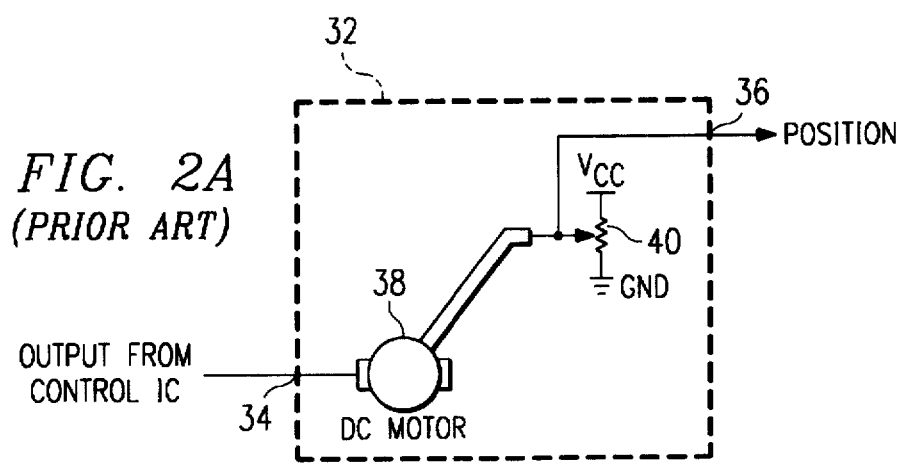
FIG. 2A illustrates a typical system to be controlled in the present invention.
Figure 2B:
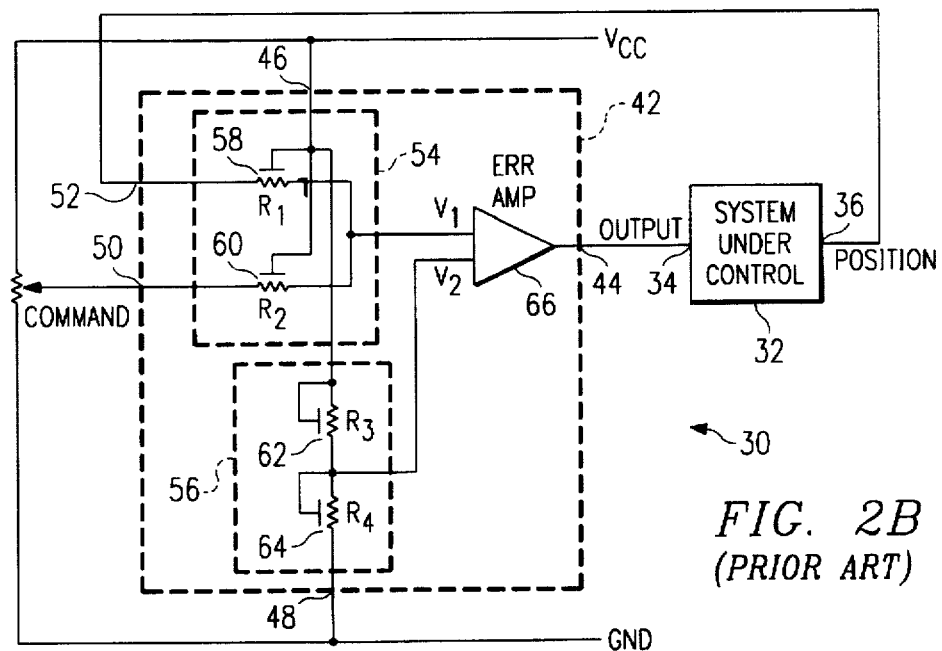
FIG. 2B illustrates a prior art control system for controlling the system depicted in FIG. 2A.
Figure 3:
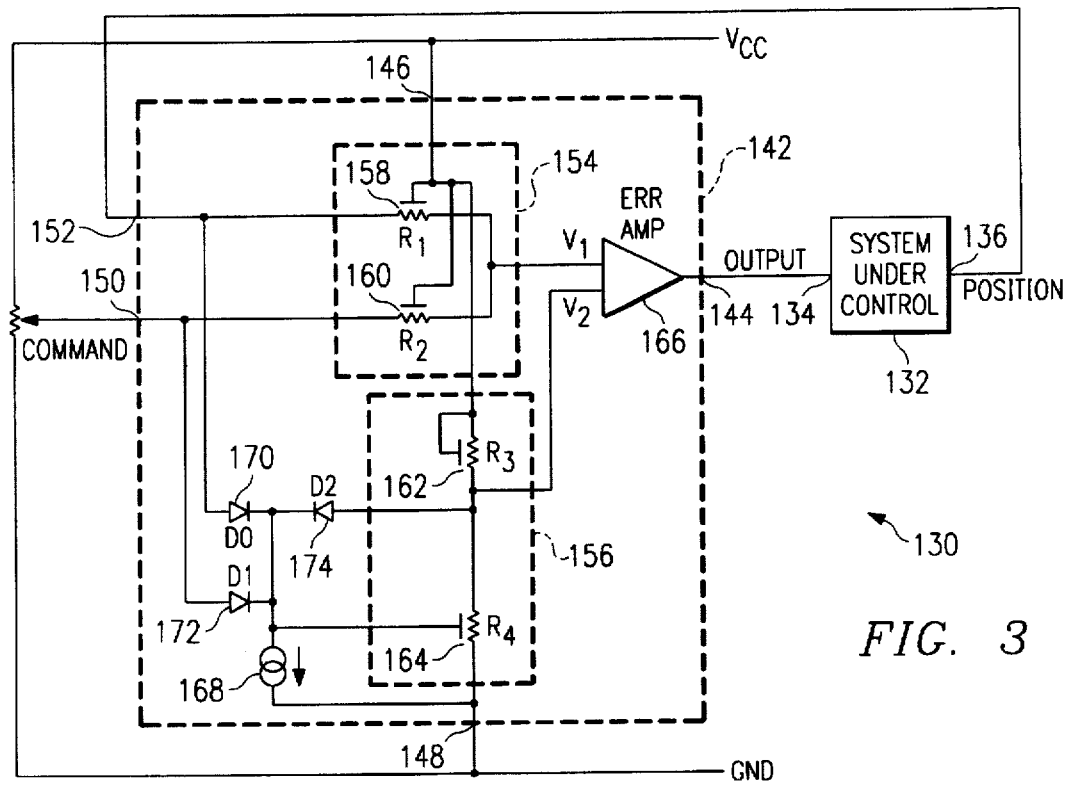
FIG. 3 illustrates a control system embodying the present invention.

Referring now to FIG. 3, a control system 130 according to the present invention is shown. Reference numerals used in FIG. 3 which are identical, like or similar to reference numerals used in FIGS. 1A, 1B, 2A, or 2B, indicate like or similar components. Control system 130 is identical to control system 30 of FIG. 2B except for the following described differences. Tub tie contact 12 of resistor 164 is coupled to position feedback signal input 152 and command signal input 150 via diodes 170 and 172, respectively. Diodes 170 and 172 collectively act as a switch to bias tub tie contact 12 of resistor 164 with the highest voltage potential of the position feedback signal or command signal. Thus, if $V_{COM} > V_{FB}$, then diodes 170 and 172 couple the command signal to tub tie contact 12 of resistor 164. However, if $V_{FB} > V_{COM}$, then diodes 170 and 172 couple the position feedback signal to tub tie contact 12 of resistor 164. Diode 174 prevents junction 27 of resistor 164 from becoming forward biased. Diodes 170, 172, 174 are ideal diodes with no forward voltage drop. Ibias 168 prevents tub tie contact 12 of resistor 164 from floating high and does not introduce errors. It is to be appreciated that resistor ratio matching (i.e., R1/R2 must equal R3/R4) is required when the system under control 32 comes to rest.

Note that other power supply voltages, resistor diffusions, technologies, and resistor ratios can be used. For example, resistors 58, 60, 62, and 64 may be n type diffused resistors.

The following demonstrates the error introduced into control system 130 by the bias voltages applied to tub tie contacts 12, contacts 14, and contacts 16 of resistors 158, 160, 162, 164 utilizing the same assumptions used for the demonstration of error introduced into control system 30. With $V_{COM} > V_{FB}$ and the command signal biasing resistor 164, it follows that:

$$\frac{R1}{R2} = \frac{1+C_V\left(V_{CC} - \frac{V_{COM}+V_1}{2}\right)}{1+C_V\left(V_{CC} - \frac{V_1+V_{FB}}{2}\right)} \text{ and}$$

$$\frac{R3}{R4} = \frac{1+C_V\left(V_{CC} - \frac{V_{CC}+V_2}{2}\right)}{1+C_V\left(V_{COM} - \frac{V_2}{2}\right)}.$$

When system 132 is at rest, $V_1=V_2=V_{CC}/2$, and $V_{COM}+V_{FB}=V_{CC}$. Thus, $$\frac{R1}{R2} = \frac{1+C_V\left(V_{CC} - \frac{V_{COM}}{2} - \frac{V_{CC}}{4}\right)}{1+C_V\left(V_{CC} - \frac{V_{CC}}{4} - \frac{V_{CC}}{2} + \frac{V_{COM}}{2}\right)} =$$

-continued $$\frac{1 + C_V\left(3/4 V_{CC} - \frac{V_{COM}}{2}\right)}{1 + C_V\left(1/4 V_{CC} + \frac{V_{COM}}{2}\right)} \text{ and}$$

$$\frac{R_3}{R_4} = \frac{1 + C_V\left(V_{CC} - \frac{V_{CC}}{2} - \frac{V_{CC}}{4}\right)}{1 + C_V\left(V_{COM} - \frac{V_{CC}}{4}\right)} =$$

$$\frac{1 + C_V(1/4 V_{CC})}{1 + C_V\left(V_{COM} - \frac{V_{CC}}{4}\right)}$$

Again, with $C_V=0.003$ and $V_{CC}=20v$, the following table illustrates that the percentage error of $R_1/R_2-R_3/R_4$ is approximately 0.01%.

TABLE 1

ERROR IN CONTROL SYSTEM 130

| $V_{COM}$ | $\frac{R_1}{R_2}$ | $\frac{R_3}{R_4}$ |
|---|---|---|
| $V_{CC}$ | .9713 | .9713 |
| .9 $V_{CC}$ | .9977 | .9769 |
| .8 $V_{CC}$ | .9827 | .9826 |
| .7 $V_{CC}$ | .9884 | .9883 |
| .6 $V_{CC}$ | .9942 | .9941 |
| .5 $V_{CC}$ | 1.000 | 1.000 |

If $V_{FB} > V_{COM}$ and the position feedback signal biases resistor 164, then 0.5 $V_{CC}$ to 0v will be the mirror image of Table 1.

In summary, by tying the tub tie contact 12 of resistor 164 to a varying rather than fixed voltage signal, such as the command and feedback signals, a substantial reduction (2.9% to 0.01%) in the error introduced by the bias voltages is achieved.

Although the present invention and its advantages have been described in detail, it should be understood that various changes, substitutions and alterations can be made herein without departing from the spirit or scope of the invention as defined in the appended claims.

What is claimed is:

1. A controller for controlling a system including a circuit comprising:

a command signal input for inputting a command signal;

a feedback signal input for inputting a feedback signal from said system;

a first resistor divider circuit including first and second resistors for outputting a first signal in response to said command and feedback signals;

a second resistor divider circuit including third and fourth resistors, responsive to said command and feedback signals for outputting a second signal for comparison to said first signal to generate a comparison signal;

tub tie contacts operably associated with said first and second resistor divider circuits for introducing bias voltages for biasing said first, second, third, and fourth resistors of said first and second resistor divider circuits; and wherein at least one of said command signal or feedback signal inputs is coupled to at least one of said tub tie contacts for biasing at least one of said first, second, third, or fourth resistors with either said command or feedback signal so as to minimize error introduced by said bias voltages in a comparison of said first and second signals.

2. The controller, as recited in claim 1, wherein said controller is an integrated circuit.

3. The controller, as recited in claim 1, further comprising comparator means for comparing said first and second signals.

4. The controller, as recited in claim 1, wherein said first and second resistor divider circuits are integrated circuits.

5. The controller, as recited in claim 4, wherein said first, second, third, and fourth resistors are diffused resistors.

6. The controller, as recited in claim 1, wherein the ratios of resistance values of said first resistor to said second resistor and said third resistor to said second resistor are set so that said first signal substantially equals said second signal when said system comes to rest.

7. The controller, as recited in claim 1, wherein said controller is a motor controller.

8. The controller, as recited in claim 1, further comprising switch means for selecting one of said command or feedback signals for biasing one of said first, second, third, and fourth resistors.

9. The controller, as recited in claim 8, wherein said switch means includes means for comparing the voltage potentials of said command and feedback signals and means for selecting said command or feedback signal having the highest potential.

10. A method for controlling a system, said method comprising the steps of:

providing a first resistor divider circuit including first and second resistors having first and second tub ties for outputting a first signal in response to command and feedback signals;

providing a second resistor divider circuit including third and fourth resistors having third and fourth tub ties, responsive to said command and feedback signals, for outputting a second signal for comparison to said first signal to generate a comparison signal;

introducing bias voltages to said first, second, third, and fourth tub ties for biasing said first, second, third, and fourth resistors of said first and second resistor divider circuits; and biasing at least one of said first, second, third, or fourth tub ties of said first, second, third, and fourth resistors with at least one of said command or feedback signals so as to minimize error introduced by said bias voltages in a comparison of said first and second signals.

11. The method, as recited in claim 10, wherein said method is implemented in an integrated circuit.

12. The method, as recited in claim 10, wherein said system is a motor.

13. The method, as recited in claim 10, wherein said first, second, third, and fourth resistors are diffused resistors.

14. The method, as recited in claim 10, further comprising the step of setting the ratios of resistance values of said first resistor to said second resistor and said third resistor to said fourth resistor so that said first signal substantially equals said second signal when said system comes to rest.

15. The method, as recited in claim 10, further comprising the step of comparing said first and second signals to generate said comparison signal for controlling said system.

16. The method, as recited in claim 10, further comprising the steps of:

inputting said command signal to said first and second resistor divider circuits; and inputting said feedback signal to said first and second resistor divider circuits from said system.

17. The method, as recited in claim 10, further comprising the step of selecting one of said command or feedback signals for biasing one of said first, second, third, and fourth resistors.

18. The method, as recited in claim 17, wherein said step of selecting further comprises the steps of comparing the voltage potentials of said command and feedback signals and selecting said command or feedback signal having the highest potential.

19. An integrated circuit for controlling a motor comprising:

a command signal input for inputting a command signal for controlling said motor;

a feedback signal input for inputting a feedback signal from said motor;

a first resistor divider circuit having first and second resistors for outputting a first signal in response to said command and feedback signals;

a second resistor divider circuit having third and fourth resistors for outputting a second signal for comparison to said first signal;

a comparator/amplifier for comparing said first and second signals;

each of said resistors including a tub tie contact for introducing a bias voltage wherein said bias voltage of said first, second, and third resistors are fixed; and switch means for selectively biasing said fourth resistor with one of said command or feedback signals so as to minimize error introduced by said bias voltage in a comparison of said first and second signals.

20. The integrated circuit, as recited in claim 19, wherein said switch means includes means for comparing the voltage potentials of said command and feedback signals and means for selecting said command or feedback signal having the highest potential.

* * * * *